United States Patent [19]
Hung et al.

[11] Patent Number: 6,055,186
[45] Date of Patent: Apr. 25, 2000

[54] REGULATED NEGATIVE VOLTAGE SUPPLY CIRCUIT FOR FLOATING GATE MEMORY DEVICES

[75] Inventors: Chun-Hsiung Hung, Hsinchu; Yin-Shang Liu, Tsao-Twen; Hao-Hsiung Yang, Taipei, all of Taiwan

[73] Assignee: Macronix International Co., Ltd., Hsinchu, Taiwan

[21] Appl. No.: 09/177,937

[22] Filed: Oct. 23, 1998

[51] Int. Cl.[7] .................................................. G11C 16/04
[52] U.S. Cl. ................................ 365/185.18; 365/185.2; 365/185.23; 365/226
[58] Field of Search ......................... 365/185.18, 185.2, 365/226, 185.23; 327/512, 513, 536, 538

[56] References Cited

U.S. PATENT DOCUMENTS

| | | | |
|---|---|---|---|
| 4,481,566 | 11/1984 | Hoffman et al. | 363/60 |
| 4,685,083 | 8/1987 | Leuschner | 365/185 |
| 5,218,571 | 6/1993 | Norris | 365/189.09 |
| 5,331,592 | 7/1994 | Yamagata | 365/185 |
| 5,349,220 | 9/1994 | Hong | 257/322 |
| 5,406,524 | 4/1995 | Kawamura et al. | 365/226 |
| 5,532,640 | 7/1996 | Okunaga | 327/536 |
| 5,537,362 | 7/1996 | Gill et al. | 365/233.5 |
| 5,553,030 | 9/1996 | Tedrow et al. | 365/226 |
| 5,581,107 | 12/1996 | Kawamura et al. | 257/392 |
| 5,612,921 | 3/1997 | Chang et al. | 365/226 |
| 5,631,597 | 5/1997 | Akaogi et al. | 327/536 |
| 5,659,502 | 8/1997 | Sali et al. | 365/185.18 |
| 5,663,907 | 9/1997 | Frayer et al. | 365/185.18 |
| 5,721,707 | 2/1998 | Villa et al. | 365/218 |
| 5,745,414 | 4/1998 | Engh et al. | 365/185.2 |
| 5,754,476 | 5/1998 | Caser et al. | 365/185.29 |

OTHER PUBLICATIONS

Atsumi, S. et al., "A 16–Mb Flash EEPROM with a New Self–Data–Refresh Scheme for a Sector Erase Operation", *IEEE Journal of Solid–State Circuits*, vol. 29, No. 4, Apr. 1994, pp. 461–469.

Venkatesh et al., "A 55ns 0.35 Micron 5V–Only 16M Flash Memory with Deep–Power–Down", ISSCC 96, Session 2, Flash memory, Paper TP2.7, pp. 44–45 (1996).

*Primary Examiner*—Son T. Dinh
*Attorney, Agent, or Firm*—Haynes & Beffel LLP

[57] ABSTRACT

A technique for regulating a negative voltage charge pump to induce Fowler-Nordheim tunneling in floating gate cells controls applied bias to compensate for variations in the supply potential VDD, temperature, and the gate coupling ratio (GCR) or other characteristics of the memory cells which depend on manufacturing processes. A supply circuit for a negative voltage includes a voltage regulator that is coupled to the negative voltage source to maintain the negative voltage at a regulated level. The regulator includes an element that establishes the regulated level according to the manufacturing processes and temperature of the device. The regulator also comprises a circuit which establishes the regulated level in response to the supply voltage. Thus, where the negative voltage generator is utilized in a floating gate memory device, the element that establishes the regulated level according to manufactured processes and temperatures comprises a floating gate transistor manufactured according to the same processes as the non-volatile memory cells in the array on the device.

25 Claims, 5 Drawing Sheets

FIG. 1 -
PRIOR ART

REGULATED NEGATIVE VOLTAGE SUPPLY CIRCUIT FOR FLOATING GATE MEMORY DEVICES

BACKGROUND OF THE INVENTION

1. Field of the Invention

The present invention relates to floating gate memory devices, and more particularly to circuits for generating a negative voltage to be applied to a control gate, or other terminal on the memory cell, in such a way that electric field magnitude is controlled across the memory cell for inducing Fowler-Nordheim tunneling.

2. Description of Related Art

Flash memory devices are based on arrays of floating gate memory cells which are programmed in some cases by biasing the memory cells to induce hot electron injection into the floating gate increase the threshold of the memory cell. Also, in many examples the cells are erased by biasing the cells to induce Fowler-Nordheim FN tunneling of electrons out of the floating gate in order to establish a low threshold state. In other cases, FN tunneling is used for both program and erase operations.

One common approach inducing FN tunneling for the erase operation is referred to as source side erase. According to this approach, a negative voltage is applied to the word line of cells in the array to be erased, while a positive voltage or ground, is applied to the source. This biasing establishes an electric field between the floating gate and the source to induce Fowler-Nordheim tunneling. While the gate receives a negative voltage and the source receives a positive voltage or ground, the substrate is grounded and the drain is typically left floating. See U.S. Pat. No. 5,077,691; invented by Haddad, et al.; issued Dec. 31, 1991. In circuits using some cell types, a negative voltage is applied to one of the drain, source or channel to induce charge flow in an opposite direction.

To support the source side erase operation or other negative voltage functions, integrated circuits include a negative voltage charge pump or other source of negative voltage on the integrated circuit. As commented in U.S. Pat. No. 5,077,691, column 2, line 30 to line 68, very high voltages applied at the source of a cell when erasing may result in a relatively high source to substrate current that an on-chip charge pump can not support. When the source voltage is lower, such as that at the supply potential VDD or even lower than VDD, the negative gate bias has to be increased in magnitude accordingly, to ensure that the same vertical field is kept to generate FN tunneling. Also, lower source voltage may help to alleviate the generation of hole trapping at the gate dielectric. Band-to-band tunneling caused by higher source voltage is another unwanted effect.

However, it is found that because of variations in the supply potential VDD of as much as 10% according to industry standards, manufacturing process variations, changes in temperature and variations in current loading on the cells, the voltage applied across the flash cell during erase cannot be maintained in many circumstances to provide predictable erase speed. As a result, the electric field and the effect of a given electric field across the floating gate and source will vary, and the erase time for cells can vary dramatically. There have been some attempts to regulate the negative voltage generation. See for example Venkatesh, et al., "A 55ns 0.35 Micron 5V-Only 16M Flash Memory With Deep-Power-Down" ISSCC 96/Session 2/Flash Memory/ Paper TP2.7, pp. 44–45, 1996; and Atsumi, et al., "A 16-Mb Flash EEPROM with a New Self-Data-Refresh Scheme for a Sector Erase Operation; IEEE Journal of Solid State Circuits, Vol. 29, No. 4, April 1994.

FIG. 1 illustrates a prior art regulator which roughly speaking compensates for variations in the supply potential VDD. The regulator works with a negative voltage charge pump 500 which applies a negative voltage on line 501. A pair of zener diodes 503 and 504 are connected in series to the drain of p-channel transistor 505. The source of p-channel transistor 505 is connected to the supply potential VDD. The gate of the transistor 505 is driven by the output of comparator 506. The inputs to comparator include a reference voltage $V_{REF}$, and the voltage on the node connecting the drain of the p-channel transistor 505 and the cathode of the zener diode 504.

Generally, the circuit of FIG. 1 compensates for supply voltage variations through transistor 505. When the supply potential is higher, the negative voltage on node 501 tends to go more negative. This causes the voltage in the drain of the p-channel transistor 505 to go more negative as well. This will cause the output of the comparator to go lower to allow the node to be pulled up towards the supply potential through the p-channel transistor 505. In this way, the negative voltage can be compensated to have a less negative output. Similarly with a lower supply potential, the voltage on the gate of the transistor 505 is higher causing the voltage on the drain to go lower. This allows a more negative voltage on node 501.

However, it is desirable to provide an improved control over the erase time of flash memory cells, while maintaining the efficiency of the erasing operation.

SUMMARY OF THE INVENTION

The present invention provides a technique for regulating a charge pump, particularly a negative voltage charge pump to induce Fowler-Nordheim tunneling in floating gate cells, such that the applied bias compensates for variations of the supply potential VDD, is slightly reverse dependent on temperature, and is reverse dependent on the gate coupling ratio (GCR) or other characteristics of the memory cells which depend on manufacturing processes.

Thus, the present invention provides a supply circuit for a negative voltage to one of a control gate, source, channel and drain of a floating gate cell, which includes a voltage regulator to maintain the negative voltage at a regulated level. The regulator includes an element that establishes the regulated level according to the manufacturing processes and temperature of the device. In another embodiment, the regulator comprises a circuit which establishes the regulated level in response to the supply voltage. Thus, where the negative voltage generator is utilized in a floating gate memory device, the element that establishes the regulated level according to manufactured processes and temperatures comprises a floating gate transistor manufactured according to the same processes as the non-volatile memory cells in the array on the device.

According to another aspect of the invention, the negative voltage source comprises a charge pump that generates a negative voltage power source for wordlines to be erased according to Fowler-Nordheim tunneling. The voltage regulator comprises a second negative voltage charge pump and a clamping circuit that comprises a zener diode and a floating gate transistor which matches the memory cells in the array to be erased. The zener diode and floating gate transistor are connected in series to a reference terminal which is provided by a voltage source responsive to the supply potential VDD. For example, the reference voltage may be the supply potential directly, or a divided down version of the supply potential such that variations in the supply potential are compensated for by the action of the clamping circuit. In addition, a capacitor is connected between the output of the regulator negative charge pump and ground to provide a stabilizing or smoothing function. A voltage divider is connected between the output of the negative charge pump and the gate of a source follower transistor. The drain of the source follower transistor is coupled to the larger charge pump through which the power is supplied. The source of the transistor is coupled to the wordline drivers for the array in a source follower configuration so that the voltage on the gate of the transistor is able to regulate the voltage supplied to the wordline drivers.

According to the scheme of the present invention the clamping path, which includes the zener diode and the floating gate transistor, suppresses process, supply voltage and temperature variations. For a given temperature, the ideal zener diode break down voltage remains constant. Thus when supply voltage increases, the reference voltage on the gate of the floating gate transistor increases which forces one side of the zener diode to increase and the other side of the diode to decrease in absolute value as a result of the non-ideal resistance of the diode times the increasing current from the charge pump due to higher supply voltage. This effect may also help to lower the absolute value of the output of the voltage regulator. If the temperature increases, the threshold for the floating gate transistor in the clamping circuit decreases. This results in an increase (less negative) in the output of the regulator allowing a less bias voltage at higher temperature. Similarly, when the gate coupling ratio increases, the threshold on the floating gate transistor and the clamping circuit decreases. This also results in an increase (less negative) in the regulator voltage providing for less bias on the array.

According to another aspect of the invention, a floating gate memory device is provided which includes a power supply terminal providing a supply voltage, circuits for reading, programming and erasing memory cells in the array, and a circuit for erasing memory cells by applying a negative voltage to wordlines in the array. The circuit for erasing memory cells includes the negative voltage source and voltage regulator as described above. This allows for more uniform erasing speed, and easier control of the erasing process on the integrated circuit.

Other aspects and advantages of the present invention can be seen upon review of the figures, the detailed description and the claims which follow.

DETAILED DESCRIPTION

Figure 1:
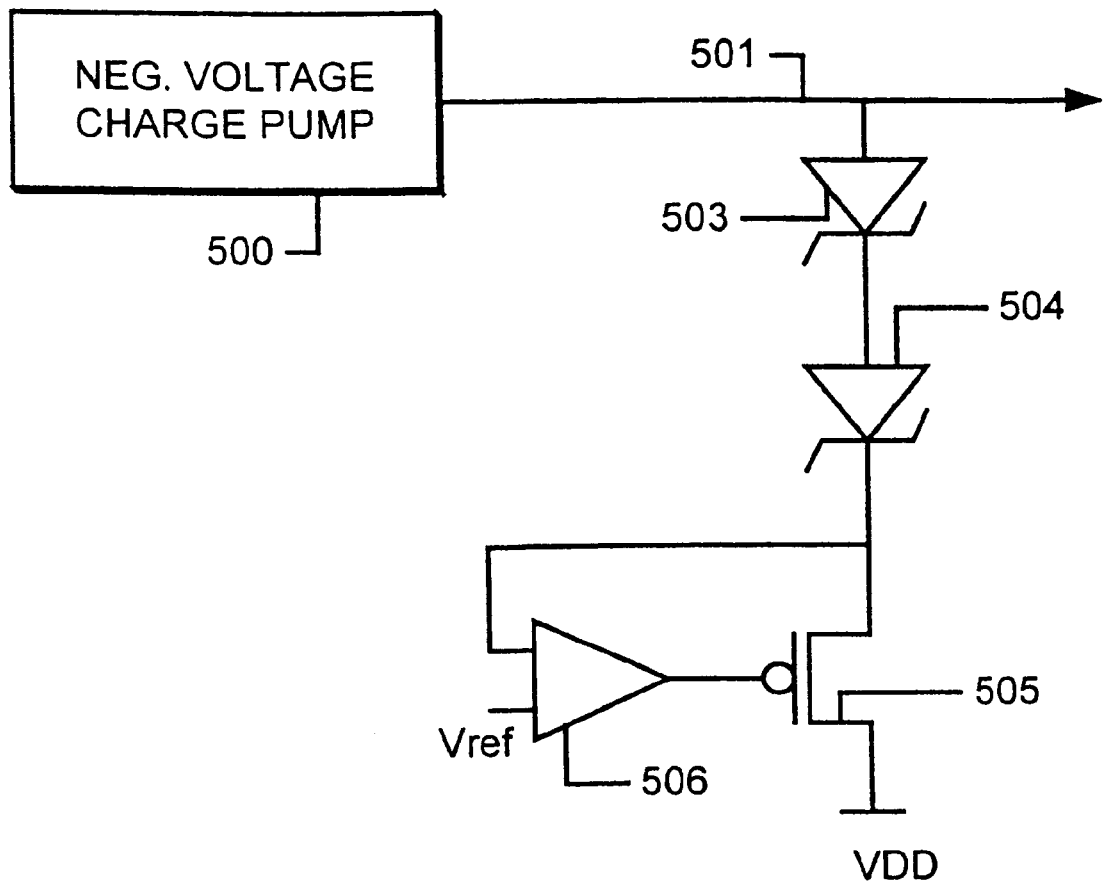
FIG. 1 is a diagram of a circuit believed to be found in the prior art for regulating a negative voltage charge pump.
Figure 2:
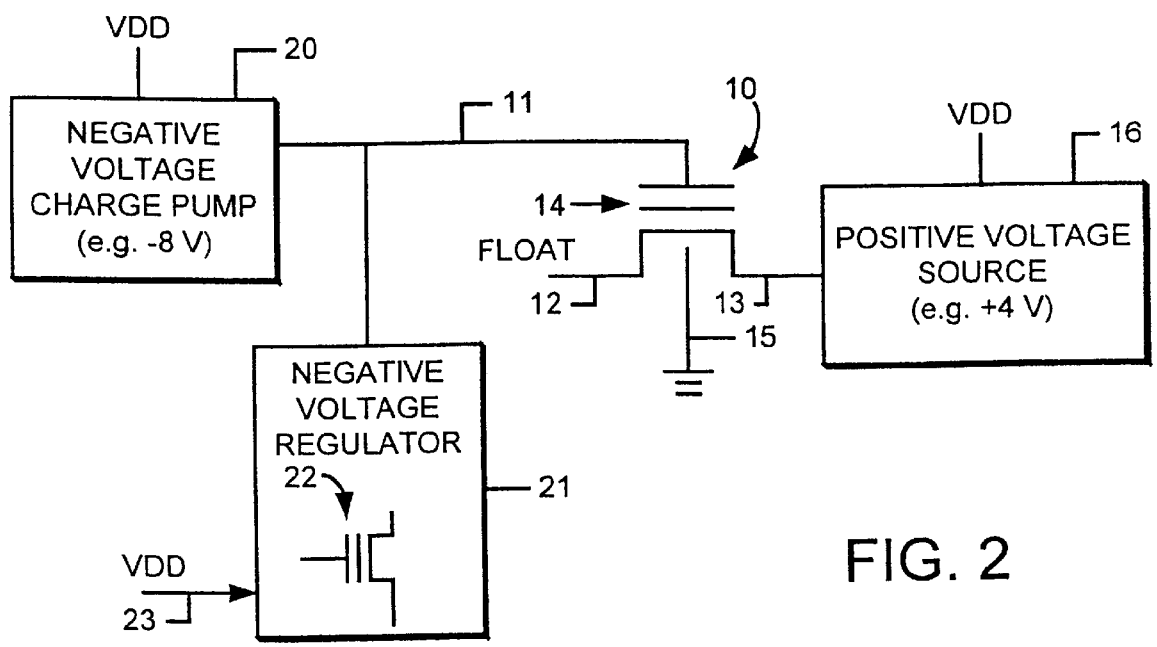
FIG. 2 is a simplified diagram illustrating the source side Fowler-Nordheim Tunneling erase operation according to the present invention with a negative voltage regulator including a reference cell to compensate for manufacturing process, temperature and supply voltage variations.

A detailed description of the present invention is provided with respect to FIGS. 2–6. In FIG. 2, a simplified diagram of a circuit according to the present invention is provided. As shown in FIG. 2, a flash memory floating gate cell 10 having a control gate on line 11, a drain on line 12, and a source on line 13 is provided. The floating gate cell 10 includes a floating gate 14. The channel of cell 10 is coupled in this simplified example to a substrate represented by line 15 which is grounded for the erase operation. U.S. Pat. No. 5,668,758 is incorporated by reference as if fully set forth herein, to provide a description of a basic cell structure and operational condition for one embodiment. To induce erase according to a source side erase approach, a source potential is applied to line 13 through a positive voltage source responsive to the supply potential VDD. The positive voltage source comprises for one example a source follower transistor, if the supply potential is greater than the source voltage to be applied, or for another example, a charge pump circuit for source voltage higher than the supply potential.

During the source side erase, the drain terminal 12 is left floating, by disconnecting bitlines coupled to the drain. A negative voltage NVPP is applied to line 11. The negative voltage NVPP is generated by a charge pump 20 having a negative voltage regulator 21 coupled to it. The negative voltage charge pump 20 for one embodiment, is described in U.S. Pat. No. 5,532,960 entitled NEGATIVE VOLTAGE GENERATOR FOR FLASH EEPROM, issued Jul. 2, 1996, which relies on a high program potential VPP to be applied. Other charge pump circuits for producing negative voltages, known in the art, are also suitable for other embodiments which do not rely on the VPP supply potential.

According to the present invention, the negative voltage regulator 21 includes a reference cell 22 or an array of cells, manufactured according to the processes use to manufacture the memory cell 10, in order to control the negative voltage NVPP on line 11 in a manner that tracks changes in the memory cell 10, due to variations in manufacturing processes and temperature. The negative voltage regulator is also responsive to the supply potential VDD, as indicated by line 23, to control the output of the negative voltage generator 20 so as to compensate for variations in the supply potential. By more precise regulation of the negative voltage, a more predictable erase speed can be maintained.

Figure 3:
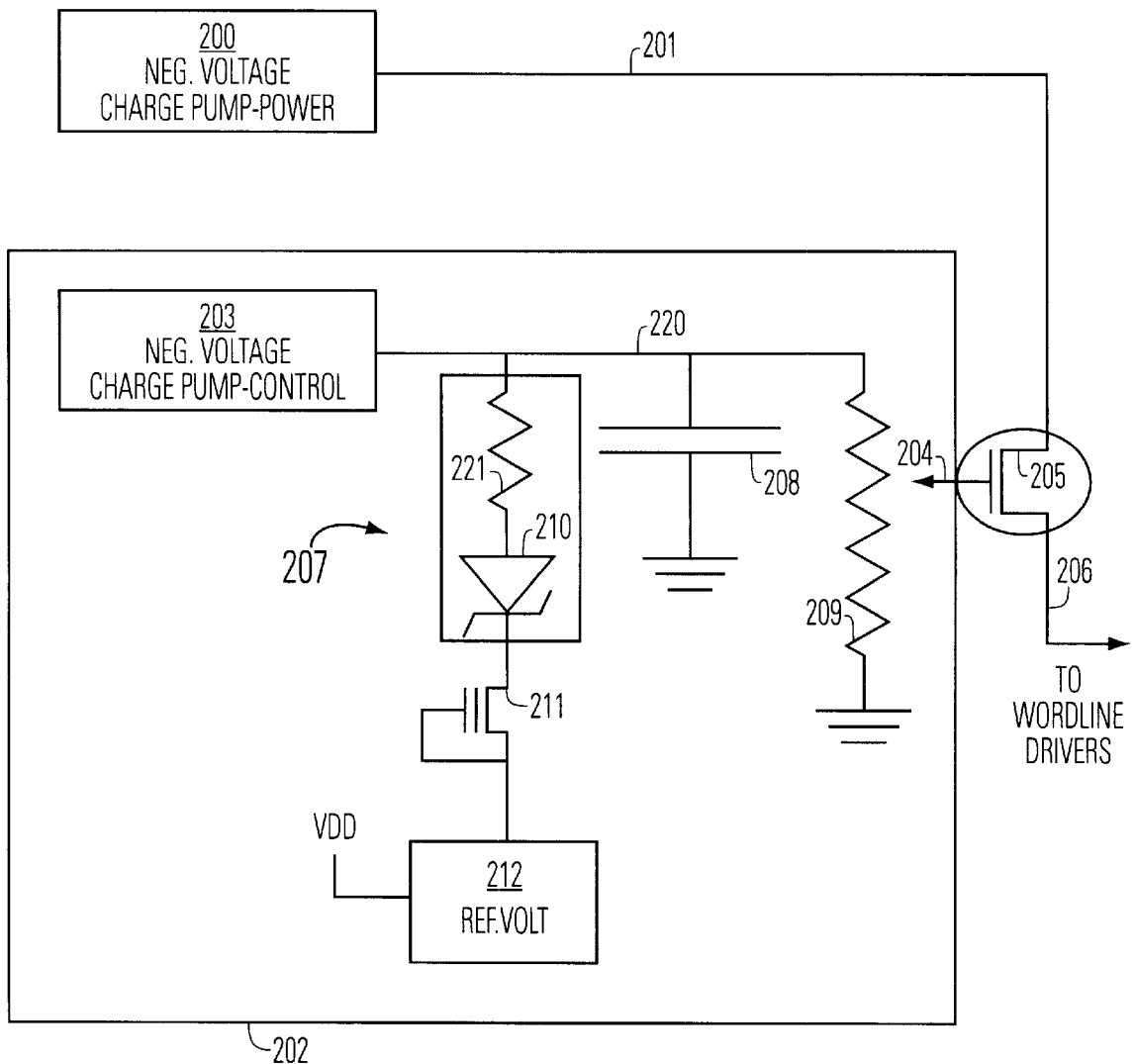
FIG. 3 is a circuit diagram of a preferred embodiment of the negative voltage regulator of FIG. 2.

FIG. 3 is a simplified diagram of a negative voltage source including the regulator of the present invention. FIG. 3 illustrates a negative voltage charge pump 200 which is used to supply power at a negative voltage on line 201 to drive wordlines in the array. A negative voltage regulator 202 is also illustrated including a second charge pump 203 which is used to provide the negative voltage control on line 204. Line 201 is connected to the drain of a source follower MOS transistor 205. Line 204 is connected to the gate of the transistor 205. The source of the transistor 205 is coupled to line 206 which is applied to wordline drivers in the array.

The regulator according to the present invention includes a clamping circuit, generally 207, a smoothing capacitor 208, and a voltage divider 209. The clamping circuit 207 includes a zener diode 210, which includes a diode turn on resistance 221 represented by the resistor symbol. Also the clamping circuit according to the present invention includes an element, in this case floating gate transistor 211 which is manufactured according to the same processes as memory cells in the array receiving a negative voltage, and has a gate coupling ratio which varies according to the same process parameters as cells in the array. The element 211 in this example has its control gate coupled to its drain. The drain of the element 211 is connected to a reference voltage source 212 which is responsive to the supply potential VDD. The reference voltage 212 may be a direct connection to the supply potential, or a version which is divided down according to any of a variety of techniques. However, the voltage generated by the reference voltage source 212 varies as does the supply potential VDD. The clamping circuit 207 is connected between line 220 at the output of the negative voltage charge pump 203 and the reference voltage source 212.

The capacitor 208 is connected between the line 220 and ground. This smooths out ripple produced by the negative voltage charge pump 203 to provide a more stable output voltage. The voltage divider 209 is represented by resistor element. The voltage divider is connected between line 220 and ground. The tap on the voltage divider is connected to line 204 to drive the gate of transistor 205.

The voltage divider 209 of FIG. 3 is illustrated by a resistor. It could be implemented by a triple well n-channel MOS transistor, a resistor, or combinations of resistors and transistors.

In alternative embodiments, the gate of element 211 is connected to a reference potential or other bias source, such as a bias formed by dividing down the supply potential.

The negative voltage on line 206 which is used for application to wordline drivers will be set equal to the voltage on line 204 provided by the voltage divider 209, plus the threshold of transistor 205. This negative voltage is defined by the voltage on line 220 at the intersection of the load line of the charge pump 203 and the action of the damper circuit 207. Zener diode 210 defines the voltage drop of the damper circuit first order. The element 211 and the voltage reference 212 provide for the characteristics of the present invention so that the voltage on line 220 compensates for variations in manufacturing processes, temperature and supply voltage encountered at memory cells in the array to be erased.

In a typical array, the absolute value of the negative voltage applied the wordlines would be larger at a higher supply potential due to larger charge pump current and non-zero turn-on resistance 221 of the zener diode 210. Also the breakdown voltage of the zener diode 210 is larger at higher temperature. Thus, the tunneling current would be larger at higher supply potential and higher temperature and smaller at lower supply potential and lower temperature in the prior art. Also in the prior art, the applied bias that induces a tunneling current is the bias between the floating gate and the source or other terminal of the transistor at which tunneling is being induced. Thus, the gate coupling ratio of the cell is also critical in determining the applied bias. A higher gate coupling ratio would increase the electric field across the tunneling oxide between the floating gate and the source for example, for a given bias voltage. Thus, in prior art systems, a variation in the gate coupling ratio will also induce variation in erasing speeds.

According to the embodiment of FIG. 3, as a supply potential VDD increases, the voltage supplied by node 212 increases. For a given temperature, the ideal zener diode break down voltage remains constant. When supply voltage increases, the reference voltage 212 increases which forces one side of the zener diode to increase and the other side of the diode to decrease in absolute value as a result of the non-ideal resistance of the diode times the increasing current from the negative voltage charge pump 203 caused by higher supply voltage. This may also help to lower the absolute value of voltage on line 220.

For increases in temperature, the threshold of the transistor 211 will decrease. This results in an increase in the voltage on line 220 (lesser absolute value) and thereby less bias applied to the array at higher temperatures.

As the gate coupling ratio of transistors in the array increases, so does the gate coupling ratio of the element 211. Thus, the threshold of transistor 211 will decrease, resulting in an increase (drop in absolute value) of the voltage on line 220. Thus, less bias is applied to cells in the array, when the gate coupling ratio is higher.

Accordingly, the regulator 220 results in producing a stabler, more predictable tunneling current in integrated circuit memory array based on floating gate devices, with variations in supply potential, manufacturing processes, and temperature.

Figure 4:
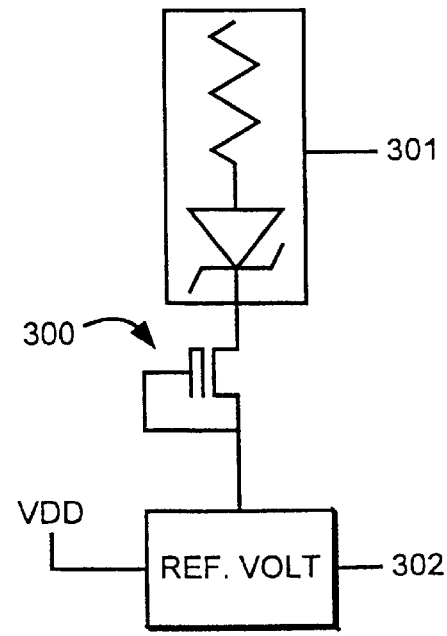
FIG. 4 illustrates an alternative implementation of the clamp circuit in of a regulator according to the present invention.

In alternative embodiments, as illustrated in FIG. 4, the clamping circuit could employ a "dummy" cell, in which the floating gate is coupled externally to the control gate as represented by the symbol 300. Thus, in the example of FIG. 4, the clamping circuit includes a zener diode 301 in series with the element 300 and the reference voltage source 302. In the case of FIG. 4, the dummy cell 300 would be manufactured so that its length is reduced or width enlarged to map for gate coupling ratio variations in the array. The reduced channel length of cell 300 also tends to make the cell 300 more sensitive to process variation than cells in the array.

Figure 5:
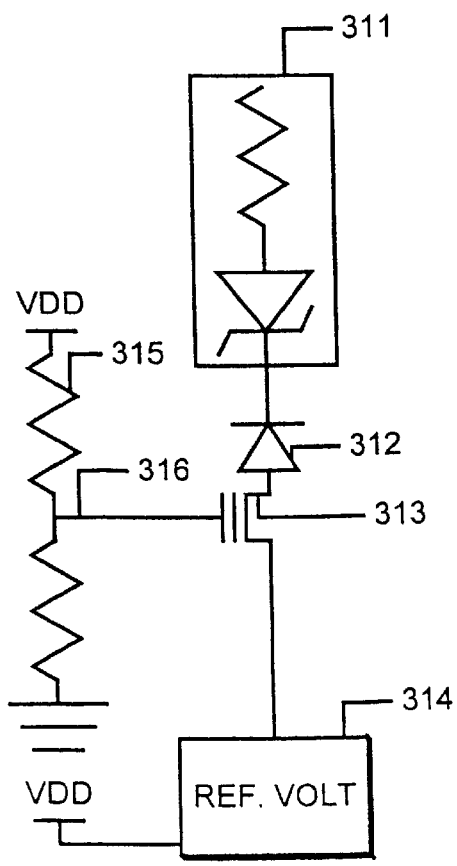
FIG. 5 illustrates yet another alternative implementation of the clamp circuit in the regulator according to the present invention.

FIG. 5 illustrates yet another alternative example of the clamping circuit employing a floating gate cell according to the present invention. In the example of FIG. 5, a zener diode 311 has its anode connected to the output of the charge pump, and its cathode connected to the cathode of a second diode 312. The second diode 312 may not be a zener diode. The anode of diode 312 is connected to the drain of the floating gate cell 313 which is manufactured using the same processes as cells in the array. The source of the floating gate memory cell 313 is connected to the reference voltage circuit 314 which is driven by the supply potential VDD. The gate of the floating gate transistor 313 is connected to a tap 316 on a voltage divider 315 between the supply potential and ground in this example. By utilizing a voltage divider 315 to apply a bias potential to the gate of the cell 313, further tuning of the clamping circuit can be accomplished.

The diode 311 and diode 312 work to compensate for variations in temperature. Because the temperature coefficient of the diode 312 is negative, and the temperature coefficient of the zener diode 311 is positive, the presence of both diodes can compensate for variations in temperature, as can be understood with reference to the following table:

| Temperature | Breakdown Voltage of Zener Diode | Cut-in Voltage of Diode |
|---|---|---|
| 85° C. | 7.9 | 0.51 |
| 25° C. | 7.7 | 0.63 |
| −40° C. | 7.4 | 0.78 |

By review of the representative breakdown and cut-in voltages in the above table, it can be understood that the presence of the diode 311 in combination with the diode 312 provides some additional stabilization over ranges of temperature.

Figure 6:
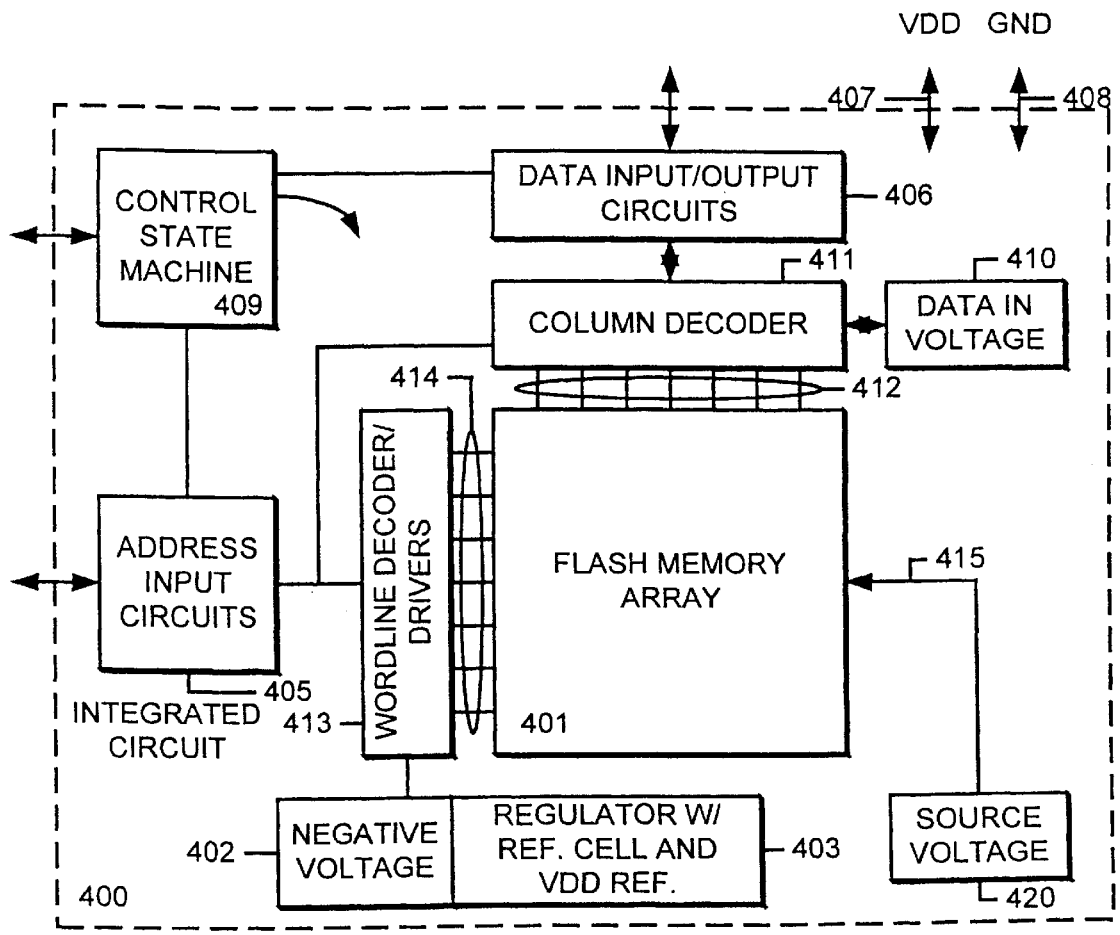
FIG. 6 is a simplified diagram of an integrated circuit memory implementing the regulated negative voltage generator of the present invention

FIG. 6 is a simplified diagram of an integrated circuit 400 including a flash memory array 401. According to the present invention, a negative voltage generator 402 on the integrated circuit 400 is regulated in response to the voltage generated by a voltage regulator 403 which includes a reference cell and supply potential reference, for use during erasing of the array as described above.

Thus, the integrated circuit 400 includes address input circuits 405, data input/output circuits 406, a supply potential input 407, and a ground input 408. A control state machine 409 is coupled to the data input/output circuits 406 and the address input circuits 405 for managing the operation of the device for read, program and erase operations. A data in voltage source 410 is coupled to a column decoder 411 and to the data input/output circuits 406 for applying voltages necessary for programming the array. The source voltage source 420 applies a voltage utilized for connection across source conductors or bitlines to the sources of transistors in the array during the erase, program and read operations. The column decoder drives a set of bitlines 412 which are used to access memory cells in the array. A wordline decoder 413 is coupled to the array. The wordline decoder includes drivers to drive wordlines 414 which are used to access memory cells in the array.

The terminal 407 is coupled to a supply voltage VDD provided by a power supply (not shown) external to the circuit. This power supply voltage is specified typically to be about 5 volts +/−10%. In alternative systems, the supply voltage VDD may be specified at lower voltages, for example from 2.6 to about 3.2 volts, depending on the particular implementation. The data-in voltage generator 410, the source voltage generator 420, and the negative voltage generator 402 are all responsive to the supply voltage VDD to generate the potentials used during the read, program and erase operations. The erasing operations executed by the control state machine 409 are implemented for example as described in U.S. Pat. No. 5,414,664 entitled FLASH EEPROM WITH BLOCK ERASE FLAGS FOR OVERERASE PROTECTION, issued May 9, 1995.

During source side erase, a negative voltage is applied from the negative voltage generator 402 to the drivers for wordlines of cells to be erased. At the same time, a positive voltage is applied from the source voltage source 420 to sources of transistors in the array as indicated by line 415. The negative voltage generator 402 is coupled to a voltage regulator 403, as described above which maintains a constant erase speed, and supports a constant erasing time for memory cells in the array. This simplifies the algorithms which must be executed to erase the array by the control state machine 409, and in general allows for a faster, more reliable erasing.

Accordingly the present invention provides an improved technique for erasing memory cells in a floating gate memory device based on a source side erase operation or other operations requiring a negative voltage to be generated. The output of the negative voltage generator is regulated to account for variations in manufacturing processes, temperature and supply voltage to maintain a more predictable erasing speed during the erase operation. This provides for easier control of the erasing algorithms, and more efficient operation of the integrated circuitry.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. For a non-volatile memory cell having a control gate, a floating gate, a source, a channel and a drain, the non-volatile memory cell having characteristics determined by manufacturing processes and temperature, and coupled to a power supply providing a supply voltage, a circuit for applying a negative voltage to the memory cell, comprising:
   a negative voltage source responsive to the supply voltage providing a negative voltage to one of the control gate, source, channel and drain of the memory cell; and
   a voltage regulator coupled to the negative voltage source to maintain the negative voltage at a regulated level, the voltage regulator comprising an element which establishes the regulated level according to the manufacturing processes and temperature.

2. The circuit of claim 1, wherein the voltage regulator comprises a circuit which establishes the regulated level in response to the supply voltage.

3. The circuit of claim 1, wherein the non-volatile memory cell comprises a floating gate transistor manufactured on an integrated circuit, and the element comprises a floating gate transistor on said integrated circuit.

4. The circuit of claim 1, wherein the non-volatile memory cell comprises a floating gate transistor manufactured on an integrated circuit, and the element comprises a floating gate transistor on said integrated circuit, and the floating gate transistor includes a floating gate and a control gate connected to the floating gate.

5. The circuit of claim 1, wherein the negative voltage source comprises a charge pump.

6. For a non-volatile memory cell having a control gate, a floating gate, a source, a channel and a drain, the non-volatile memory cell having characteristics determined by manufacturing processes and temperature, and coupled to a power supply providing a supply voltage, a circuit for applying a negative voltage to the memory cell, comprising:
   a negative voltage source responsive to the supply voltage providing a negative voltage to one of the control gate, source, channel and drain of the memory cell; and
   a voltage regulator coupled to the negative voltage source to maintain the negative voltage at a regulated level, the voltage regulator comprising an element which establishes the regulated level according to the manufacturing processes and temperature;
   wherein the negative voltage source comprises a first charge pump having an output coupled to a node, and the voltage regulator comprises a second charge pump coupled to said node and a clamping circuit comprising said element.

7. The circuit of claim 6, wherein the clamping circuit comprises a zener diode in series with said element.

8. The circuit of claim 7, including a second diode in series with the zener diode.

9. The circuit of claim 6, including a reference voltage circuit responsive to the supply potential coupled to the clamping circuit.

10. The circuit of claim 9, wherein the clamping circuit comprises a series combination including a zener diode and said element, coupled between the node and the reference voltage circuit.

11. The circuit of claim 6, including a transistor having a source, a drain coupled to the output of the first charge pump and a gate coupled to the output of the second charge pump, to produce a voltage at the regulated level on the source.

12. An integrated circuit memory device on a single semiconductor substrate, comprising:

an array of floating gate memory cells on the substrate having characteristics determined by manufacturing processes and temperature, and having wordlines selectively coupled to control gates of memory cells in the array, and conductive paths selectively coupled to drains of memory cells in the array and to sources of memory cells in the array;

a power supply terminal on the substrate for providing a supply voltage;

circuits on the substrate for reading, programming and erasing the memory cells in the array; and wherein the circuits for erasing the memory cells in the array include resources to apply a negative voltage to wordlines in the array comprising;

a negative voltage source responsive to the supply voltage providing a negative voltage to selected wordlines; and a voltage regulator coupled to the negative voltage source to maintain the negative voltage at a regulated level, the voltage regulator comprising a floating gate transistor which establishes the regulated level according to the manufacturing processes and temperature.

13. The device of claim 12, wherein the voltage regulator comprises a circuit which establishes the regulated level in response to the supply voltage.

14. The device of claim 12, wherein the floating gate transistor includes a floating gate and a control gate connected to the floating gate.

15. The device of claim 12, wherein the negative voltage source comprises a charge pump.

16. The device of claim 12, wherein the negative voltage source comprises a first charge pump having an output coupled to a node, and the voltage regulator comprises a second charge pump coupled to said node and a clamping circuit comprising said floating gate transistor.

17. The device of claim 16, wherein the clamping circuit comprises a zener diode in series with said floating gate transistor.

18. The device of claim 17, including a second diode in series with the zener diode.

19. The device of claim 16, including a reference voltage circuit responsive to the supply potential coupled to the clamping circuit.

20. The device of claim 19, wherein the clamping circuit comprises a series combination including a zener diode and said floating gate transistor, coupled between the node and the reference voltage circuit.

21. The device of claim 19, wherein the clamping circuit comprises a series combination including a zener diode, a second diode and said floating gate transistor, coupled between the node and the reference voltage circuit.

22. The device of claim 17, including a transistor having a source, a drain coupled to the output of the first charge pump and a gate coupled to the output of the second charge pump, to produce a voltage at the regulated level on the source.

23. An integrated circuit memory device on a single semiconductor substrate, comprising:

an array of floating gate memory cells on the substrate having characteristics determined by manufacturing processes and temperature, and having wordline drivers and wordlines selectively coupled to control gates of memory cells in the array, and conductive paths selectively coupled to drains of memory cells in the array and to sources of memory cells in the array;

a power supply terminal on the substrate for providing a supply voltage, circuits on the substrate for reading, programming and erasing the memory cells in the array; and wherein the circuits for erasing the memory cells in the array include resources to apply a negative voltage to wordlines in the array comprising a negative voltage source responsive to the supply voltage providing a negative voltage to selected wordlines, including a charge pump and a output transistor having a drain coupled to the charge pump and a source coupled the wordline drivers; and a voltage regulator coupled to the gate of the output transistor to maintain the negative voltage at a regulated level, the voltage regulator comprising a charge pump producing a negative voltage at an output node;

a reference voltage circuit responsive to the supply potential;

a series combination including a zener diode and a floating gate transistor, coupled between the node and the reference voltage circuit which establishes a negative voltage level according to the manufacturing processes, temperature, and the supply potential;

a capacitor coupled between the output node and a reference potential;

a voltage divider coupled between the output node of the charge pump, and the gate of the output transistor.

24. The device of claim 23, wherein the series combination includes a second diode.

25. The device of claim 23, wherein the floating gate transistor has a floating gate connected to its control gate.

* * * * *